United States Patent
Bertin et al.

(10) Patent No.: US 7,528,437 B2
(45) Date of Patent: May 5, 2009

(54) EEPROMS USING CARBON NANOTUBES FOR CELL STORAGE

(75) Inventors: Claude L. Bertin, South Burlington, VT (US); Thomas Rueckes, Rockport, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 236 days.

(21) Appl. No.: 11/053,135

(22) Filed: Feb. 8, 2005

(65) Prior Publication Data

US 2005/0174842 A1     Aug. 11, 2005

Related U.S. Application Data

(63) Continuation-in-part of application No. 10/864,186, filed on Jun. 9, 2004, now Pat. No. 7,115,901, and a continuation-in-part of application No. 10/811,373, filed on Mar. 26, 2004, now Pat. No. 7,294,877.

(60) Provisional application No. 60/543,497, filed on Feb. 11, 2004.

(51) Int. Cl.
    *H01L 29/788* (2006.01)
(52) U.S. Cl. .............. 257/315; 257/E29.3; 977/742; 977/943
(58) Field of Classification Search .............. 257/314, 257/315, E29.3; 977/742, 943
    See application file for complete search history.

(56) References Cited

U.S. PATENT DOCUMENTS

| | | | |
|---|---|---|---|
| 3,448,302 A | 6/1969 | Shanefield et al. | |
| 4,845,533 A | 7/1989 | Pryor et al. | |
| 4,853,893 A | 8/1989 | Eaton et al. | |
| 4,876,667 A | 10/1989 | Ross et al. | |
| 4,888,630 A | 12/1989 | Paterson et al. | |
| 4,979,149 A | 12/1990 | Popovic et al. | |

(Continued)

FOREIGN PATENT DOCUMENTS

| | | |
|---|---|---|
| GB | 2364933 | 2/2002 |
| JP | 2004-090208 | 3/2004 |
| WO | WO-00/48195 | 8/2000 |
| WO | WO-01/03208 A1 | 1/2001 |
| WO | WO 01/03208 A1 | 1/2001 |

(Continued)

OTHER PUBLICATIONS

Ajayan, P.M., et al., "Nanometre-size tubes of carbon," Rep. Prog. Phys., 1997, vol. 60, pp. 1025-1062.

(Continued)

*Primary Examiner*—Anh Phung
*Assistant Examiner*—Michael Lulis
(74) *Attorney, Agent, or Firm*—Wilmer Cutler Pickering Hale and Dorr LLP

(57) ABSTRACT

EEPROMS Using Carbon Nanotubes for Cell Storage. An electrically erasable programmable read only memory (EEPROM) cell includes cell selection circuitry and a storage cell for storing the informational state of the cell. The storage cell is an electro-mechanical data retention cell in which the physical positional state of a storage cell element represents the informational state of the cell. The storage cell element is a carbon nanotube switching element. The storage is writable with supply voltages used by said cell selection circuitry. The storage is writable and readable via said selection circuitry with write times and read times being within an order of magnitude. The write times and read times are substantially the same. The storage has no charge storage or no charge trapping.

23 Claims, 10 Drawing Sheets

U.S. PATENT DOCUMENTS

| | | |
|---|---|---|
| 5,198,994 A | 3/1993 | Natori et al. |
| 5,414,654 A | 5/1995 | Kubota et al. |
| 5,682,345 A | 10/1997 | Roohparvar et al. |
| 5,818,748 A | 10/1998 | Bertin et al. |
| 6,044,008 A | 3/2000 | Choi et al. |
| 6,048,740 A | 4/2000 | Hsu et al. |
| 6,097,241 A | 8/2000 | Bertin et al. |
| 6,097,243 A | 8/2000 | Bertin et al. |
| 6,128,214 A | 10/2000 | Kuekes et al. |
| 6,136,160 A | 10/2000 | Hrkut et al. |
| 6,159,620 A | 12/2000 | Heath et al. |
| 6,198,655 B1 | 3/2001 | Heath et al. |
| 6,232,706 B1 | 5/2001 | Dai et al. |
| 6,256,767 B1 | 7/2001 | Kuekes et al. |
| 6,314,019 B1 | 11/2001 | Kuekes et al. |
| 6,345,362 B1 | 2/2002 | Bertin et al. |
| 6,346,846 B1 | 2/2002 | Bertin et al. |
| 6,353,552 B2 | 3/2002 | Sample et al. |
| 6,373,771 B1 | 4/2002 | Fifield et al. |
| 6,376,787 B1 | 4/2002 | Martin et al. |
| 6,423,583 B1 | 7/2002 | Avouris et al. |
| 6,426,687 B1 | 7/2002 | Osborn |
| 6,445,006 B1 | 9/2002 | Brandes et al. |
| 6,515,339 B2 | 2/2003 | Shin et al. |
| 6,518,156 B1 | 2/2003 | Chen |
| 6,528,020 B1 | 3/2003 | Dai et al. |
| 6,548,841 B2 | 4/2003 | Frazier et al. |
| 6,556,487 B1 * | 4/2003 | Ratnakumar et al. ... 365/185.08 |
| 6,559,468 B1 | 5/2003 | Kuekes et al. |
| 6,574,130 B2 | 6/2003 | Segal et al. |
| 6,625,047 B2 | 9/2003 | Coleman, Jr. |
| 6,625,740 B1 | 9/2003 | Datar et al. |
| 6,643,165 B2 | 11/2003 | Segal et al. |
| 6,661,270 B2 | 12/2003 | Nagata |
| 6,673,424 B1 | 1/2004 | Lindsay |
| 6,706,402 B2 | 3/2004 | Rueckes et al. |
| 6,707,098 B2 | 3/2004 | Hofmann et al. |
| 6,750,471 B2 | 6/2004 | Bethune et al. |
| 6,759,693 B2 | 7/2004 | Vogeli et al. |
| 6,774,052 B2 | 8/2004 | Vogeli et al. |
| 6,781,166 B2 | 8/2004 | Lieber et al. |
| 6,784,028 B2 | 8/2004 | Rueckes et al. |
| 6,794,914 B2 | 9/2004 | Sani et al. |
| 6,803,840 B2 | 10/2004 | Hunt et al. |
| 6,809,462 B2 | 10/2004 | Pelrine et al. |
| 6,809,465 B2 | 10/2004 | Jin |
| 6,835,591 B2 | 12/2004 | Rueckes et al. |
| 6,836,424 B2 | 12/2004 | Segal et al. |
| 6,918,284 B2 | 7/2005 | Snow et al. |
| 6,919,592 B2 | 7/2005 | Segal et al. |
| 6,919,740 B2 | 7/2005 | Snider |
| 6,955,937 B1 | 10/2005 | Burke et al. |
| 6,968,486 B2 | 11/2005 | Matsushima |
| 6,969,651 B1 | 11/2005 | Lu et al. |
| 6,990,009 B2 | 1/2006 | Bertin et al. |
| 7,015,500 B2 | 3/2006 | Choi et al. |
| 7,054,194 B2 | 5/2006 | Liaw et al. |
| 7,115,901 B2 | 10/2006 | Bertin et al. |
| 7,115,960 B2 | 10/2006 | Bertin et al. |
| 7,161,403 B2 | 1/2007 | Bertin |
| 2001/0023986 A1 | 9/2001 | Mancevski |
| 2002/0130353 A1 | 9/2002 | Lieber et al. |
| 2002/0172963 A1 | 11/2002 | Kelley et al. |
| 2002/0173083 A1 | 11/2002 | Avouris et al. |
| 2002/0175390 A1 | 11/2002 | Goldstein et al. |
| 2002/0179434 A1 | 12/2002 | Dai et al. |
| 2003/0021141 A1 | 1/2003 | Segal et al. |
| 2003/0021966 A1 | 1/2003 | Segal et al. |
| 2003/0022428 A1 | 1/2003 | Segal et al. |
| 2003/0124325 A1 | 7/2003 | Rueckes et al. |
| 2003/0124837 A1 | 7/2003 | Rueckes et al. |
| 2003/0132823 A1 | 7/2003 | Hyman et al. |
| 2003/0165074 A1 | 9/2003 | Segal et al. |
| 2003/0177450 A1 | 9/2003 | Nugent |
| 2003/0198812 A1 | 10/2003 | Rueckes et al. |
| 2003/0199172 A1 | 10/2003 | Rueckes et al. |
| 2003/0200521 A1 | 10/2003 | DeHon et al. |
| 2003/0206436 A1 | 11/2003 | Eaton et al. |
| 2004/0023514 A1 | 2/2004 | Moriya et al. |
| 2004/0031975 A1 | 2/2004 | Kern et al. |
| 2004/0041154 A1 | 3/2004 | Watanabe et al. |
| 2004/0075125 A1 | 4/2004 | Asao |
| 2004/0075159 A1 | 4/2004 | Vogeli |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0104129 A1 | 6/2004 | Gu et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0197978 A1 | 10/2004 | Dobler et al. |
| 2004/0214366 A1 | 10/2004 | Segal et al. |
| 2004/0214367 A1 | 10/2004 | Segal et al. |
| 2004/0238907 A1 | 12/2004 | Pinkerton et al. |
| 2004/0240252 A1 * | 12/2004 | Pinkerton et al. ........... 365/151 |
| 2005/0041465 A1 | 2/2005 | Rueckes et al. |
| 2005/0047244 A1 | 3/2005 | Rueckes et al. |
| 2005/0052894 A1 | 3/2005 | Segal et al. |
| 2005/0053525 A1 | 3/2005 | Segal et al. |
| 2005/0056825 A1 | 3/2005 | Bertin et al. |
| 2005/0056866 A1 | 3/2005 | Bertin et al. |
| 2005/0056877 A1 | 3/2005 | Rueckes et al. |
| 2005/0058590 A1 | 3/2005 | Sen et al. |
| 2005/0058797 A1 | 3/2005 | Sen et al. |
| 2005/0058834 A1 | 3/2005 | Rueckes et al. |
| 2005/0059176 A1 | 3/2005 | Rueckes et al. |
| 2005/0059210 A1 | 3/2005 | Rueckes et al. |
| 2005/0062035 A1 | 3/2005 | Bertin et al. |
| 2005/0062062 A1 | 3/2005 | Bertin et al. |
| 2005/0062070 A1 | 3/2005 | Bertin et al. |
| 2005/0063210 A1 | 3/2005 | Segal et al. |
| 2005/0063244 A1 | 3/2005 | Bertin et al. |
| 2005/0065741 A1 | 3/2005 | Segal et al. |
| 2005/0068128 A1 | 3/2005 | Yip |
| 2005/0074926 A1 | 4/2005 | Bertin et al. |
| 2005/0101112 A1 | 5/2005 | Rueckes et al. |
| 2005/0128788 A1 | 6/2005 | Segal et al. |
| 2005/0139902 A1 | 6/2005 | Jung |
| 2005/0141266 A1 | 6/2005 | Jung |
| 2005/0141272 A1 | 6/2005 | Jung |
| 2005/0162896 A1 | 7/2005 | Jung |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0270824 A1 | 12/2005 | Bertin et al. |
| 2005/0279988 A1 | 12/2005 | Bertin |
| 2005/0280436 A1 | 12/2005 | Bertin |
| 2005/0281084 A1 | 12/2005 | Rueckes et al. |
| 2005/0282515 A1 | 12/2005 | Bertin |
| 2005/0282516 A1 | 12/2005 | Bertin |
| 2006/0044035 A1 | 3/2006 | Bertin |
| 2006/0061389 A1 | 3/2006 | Bertin |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al. |
| 2006/0204427 A1 | 9/2006 | Ghenciu et al. |
| 2006/0231865 A1 | 10/2006 | Rueckes et al. |
| 2006/0237805 A1 | 10/2006 | Segal et al. |
| 2006/0237857 A1 | 10/2006 | Bertin et al. |

| | | | |
|---|---|---|---|
| 2006/0250843 A1 | 11/2006 | Bertin et al. |
| 2006/0250856 A1 | 11/2006 | Bertin et al. |
| 2006/0255834 A1 | 11/2006 | Bertin |
| 2006/0276056 A1 | 12/2006 | Ward et al. |
| 2007/0015303 A1 | 1/2007 | Bertin et al. |

FOREIGN PATENT DOCUMENTS

| | | |
|---|---|---|
| WO | WO 01/44796 A1 | 6/2001 |
| WO | WO 03/091486 A1 | 11/2003 |
| WO | WO 2004/065655 A1 | 8/2004 |
| WO | WO 2004/065657 A1 | 8/2004 |
| WO | WO 2004/065671 A1 | 8/2004 |

OTHER PUBLICATIONS

Ami, S. et al., "Logic gates and memory cells based on single $C_{60}$ electromechanical transistors," Nanotechnology, 2001, vol. 12, pp. 44-52.

Avouris, Ph., "Carbon nanotube electronics," Carbon, 2002, vol. 14, 1pp. 891-1896.

Berhan, L. et al., "Mechanical properties of Nanotube sheets: alterations in joint morphology and achievable moduli in manufacturable materials," Journal of Appl. Phys., 2004, vol. 95(8), pp. 4335-4344.

Cao, J. et al., "Electromechanical properties of metallic, quasimetallic, and semiconducting carbon nanotubes under stretching," Phys. Rev. Lett., 2003, vol. 90 (15), pp. 157601-1=157601-4.

Casavant, M.J. et al., "Neat macroscopic membranes of aligned carbon nanotubes," Journal of Appl. Phys., 2003, vol. 93(4), pp. 2153-2156.

Cui, J.B. et al., "Carbon Nanotube Memory Devices of High Charge Storage Stability," Appl. Phys. Lett., 2002, vol. 81(17), pp. 3260-3262.

Dehon, A., "Array-Based Architecture for FET-Based, Nanoscale Electronics," IEEE Transactions on Nanotechnology, 2003, vol. 2(1), pp. 23-32.

Dequesnes, M. et al., "Simulation of carbon nanotube-based nanoelectromechanical switches," Computational Nanoscience and Nanotechnology, 2002, pp. 383-386.

Desquesnes, M. et al., "Calculation of pull-in voltages for carbon-nanotube-based nanoelectromechanical switches," Nanotechnology, 2002, vol. 13, pp. 120-131.

Fan, S. et al., "Carbon nanotube arrays on silicon substrates and their possible application," Physica E, 2000. vol. 8, pp. 179-183.

Farajian, A. A. et al., "Electronic transport through bent carbon nanotubes: Nanoelectromechanical sensors and switches," Phys. Rev. B, 2003, vol. 67, pp. 205423-1=205423-6.

Fischer, J.E. et al., "Magnetically aligned single wall carbon nanotube films: Preferred orientation and anisotropic transport properties," Journal of Appl. Phys., 2003, vol. 93(4), pp. 2157-2163.

Franklin, N. R. et al., "Integration of suspended carbon nanotube arrays into electronic devices and electromechanical systems," Appl. Phys. Lett., 2002, vol. 81 (5), pp. 913-915.

Fuhrer, M.S. et al., "High-Mobility Nanotube Transistor Memory," Nano Letters, 2002, vol. 2(7), pp. 755-759.

Homma, Y. et al., Growth of Suspended Carbon Nanotube Networks on 100-nm-scale Silicon Pillars,? Applied Physics Letters, 2002, vol. 81(12), pp. 2261-2263.

Kinaret, J.M. et al., "A carbon-nanotube-based nanorelay," Appl. Phys. Lett., 2003, vol. 82(8), pp. 1287-1289.

Nardelli, M. Buongiorno et al., "Mechanical properties, defects and electronic behavior of carbon nanotubes," Carbon, 2000. vol. 38, pp. 1703-1711.

Poncharal, P., et al., "Electrostatic Deflections and Electromechanical Resonances of Carbon Nanotubes," Sciences, 1999, vol. 283, pp. 1513-1516.

Radosavlievic, M. et al., "Nonvolatile molecular memory elements based on ambipolar nanotube field effect transistors," Nano Letters, 2002, vol. 2(7), pp. 761-764.

Robinson, L.A.W., "Self-Aligned Electrodes for Suspended Carbon Nanotube Structures," Microelectronic Engineering, 2003, vols. 67-68, pp. 615-622.

Rueckes, T., et al., "Carbon Nanotube-Based Nonvolatile Random Access Memory for Molecular Computing" Science, 2000. vol. 289, pp. 94-97.

Ruoff, R.S. et al., "Mechanical and thermal properties of carbon nanotubes," Carbon, 1995. vol. 33(7), pp. 925-930.

Sapmaz, S. et al., "Carbon nanotubes as nanoelectromechanical systems," Phys. Rev. B., 2003, vol. 67, pp. 235414-1=235414-6.

Soh, H. T. et al., "Integrated nanotube circuits: Controlled growth and Ohmic contacting of single-walled carbon nanotubes," Appl. Phys. Lett., 1999, vol. 75 (5), pp. 627-629.

Sreekumar, T.V., et al., "Single-wall Carbon Nanotube Films", Chem. Mater. 2003, vol. 15, pp. 175-178.

Tans, S. et al., "Room-temperature based on a single carbon nanotube," Nature, 1998. vol. 393, pp. 49-52.

Tour, J. M. et al., "NanoCell Electronic Memories," J. Am. Chem Soc., 2003, vol. 125, pp. 13279-13283.

Verrissimo-Alves, M. et al., "Electromechanical effects in carbon nanotubes: Ab initio and analytical tight-binding calculations," Phys. Rev. B, 2003, vol. 67, pp. 161401-1=161401-4.

Bernholc et al., "Mechanical and electrical properties of nanotubes", Ann. Rev. Mater. Res., vol. 32, p. 347, 2002.

Bradley, K. et al., "Flexible Nanotube Electronics", Nano Letters, vol. 3, No. 10, pp. 1353-1355. 2003.

Collins, et al., Engineering Carbon Nanotubes and Nanotube Circuits Using Electrical Breakdown, Science, vol. 292, pp. 706-709, Apr. 2001.

Kinaret, J. M. et al,, "A Carbon-nanotube-based nanorelay," Applied Physics Letters, Feb. 24, 2003, vol. 82, No. 8, pp. 1287-1289.

Martel, R., et al, "Carbon Nanotube Field-Effect Transistors and Logic Circuits," DAC 2002, Jun. 10-12, 2002, vol. 7.4, pp. 94-98.

Onoa et al., "Bulk Production of singly dispersed carbon nanotubes with prescribed lengths", Nanotechnology, vol. 16, pp. 2799-2803, 2005.

Stadermann, M. et al., "Nanoscale study of conduction through carbon nanotube networks", Phys. Rev. B 69, 201402(R), 2004.

Bachtold, A. et al., "Logic Circuits with Carbon Nanotube Transistors", Science, Nov. 9, 2001, vol. 294, pp. 1317-1320.

Chen, J. et al., "Self-aligned carbon nanotube transistors with charge transfer doping", Applied Physics Letters, vol. 86, pp. 123108-1-123108-3, 2005.

Chen, J. et al., "Self-aligned Carbon Nanotube Transistors with Novel Chemical Doping", IEDM, pp. 29.4.1-29.4.4, 2004.

Derycke, V. et al. "Carbon Nanotube Inter-and Intramolecular Logic Gates." Nano Letters, vol. 1, pp. 453-456, Sep. 2001.

Duan. X, "Indium phosphide nanowires as building blocks for nanoscale electronic and optoelectronic devices," Nature, vol. 409, pp. 66-69, Jan. 4, 2001.

Heinze, S., "Carbon Nanotubes as Schottky Barrier Transistors," Physical Review Letters, vol. 89, No. 10, pp. 106801-1-106801-4, Sep. 2, 2002.

Huang, Y. et al., "Logic Gates and Computation from Assembled Nanowire Building Blocks", Science, vol. 294, pp. 1313-1317, Nov. 9, 2001.

Javey, A. et al., "Carbon Nanotube Field-Effect Transistors with Integrated Ohmic Contacts and High-k Gate Dielectrics", Nano Letters, vol. 4, No. 3, pp. 447-450, 2004.

Javey, A. et al., "High-k dielectrics for advanced carbon-nanotube transistors and logic gates", Nature Materials, vol. 1, pp. 241-246, Dec. 2002.

Javey, A., et al., "Carbon Nanotube Transistor Arrays for Multistage Complementary Logic and Ring Oscillators." Nano Letters, vol. 2, No. 9, pp. 929-932, published on web Jul. 31, 2002.

Lin, Y.M. et al., "Novel Carbon Nanotube FET Design with Tunable Polarity", IEDM, pp. 29.2.1-29.2.4, 2004.

Luyken, R. J. et al., "Concepts for hybrid CMOS-molecular nonvolatile memories", Nanotechnology, vol. 14, pp. 273-276, 2003.

Wind, S. J. et al., "Fabrication and Electrical Characterization of Top Gate Single-Wall Carbon Nanotube Field-Effect Transistors", 14 pages.

Wind, S. J. et al., "Vertical scaling of carbon nanotube field-effect transistors using top gate electrodes", Applied Physics Letters, vol. 80, No. 20, pp. 3817-3819, May 20, 2002.

\* cited by examiner

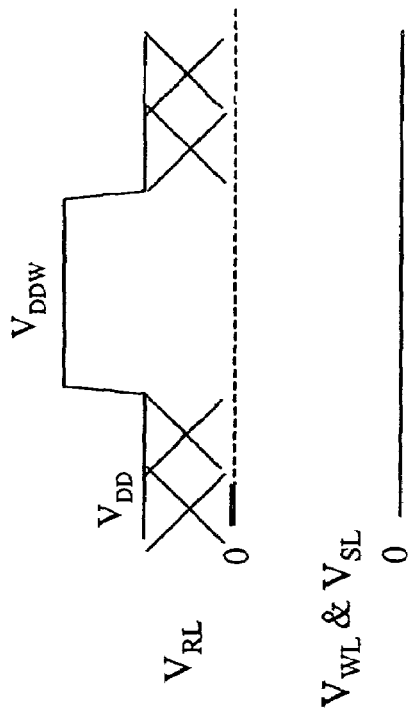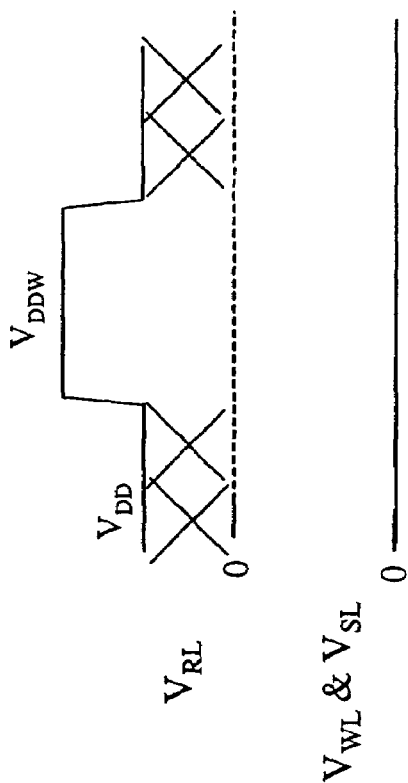
Figure 4

RELEASE FROM "1" STATE BASED ON PARTIAL SELECTION
(Unselected Release Line RL1 at $V_{DD}$)

| CELL 0: SELECTED | (Example) | CELL 2: ½ SELECTED | (Example) |
|---|---|---|---|
| $V_{RL0} = V_{DDW}$ | (2.5 V) | $V_{RL0} = V_{DDW}$ | (2.5 V) |
| $V_{WL0} = 0$ | (0 V) | $V_{WL1} = V_{DD}$ | (1.8 V) |
| $\Delta V = V_{DDW}$ | (2.5 V) | $\Delta V = V_{DDW} - V_{DD}$ | (0.7 V) |
| $V_{CNT-RL-TH} = 1.9 - 2.4\ V$ | | $V_{CNT-RL-TH} = 1.9 - 2.4\ V$ | |
| RELEASE | | NO RELEASE/DISTURB | |

| CELL 1: ½ SELECTED | (Example) | CELL 3: NOT SELECTED | (Example) |
|---|---|---|---|
| $V_{RL1} = V_{DD}$ | (1.8 V) | $V_{RL1} = V_{DD}$ | (1.8 V) |
| $V_{WL0} = 0$ | (0 V) | $V_{WL1} = V_{DD}$ | (1.8 V) |
| $\Delta V = V_{DD}$ | (1.8 V) | $\Delta V = 0$ | (0 V) |
| $V_{CNT-RL-TH} = 1.9 - 2.4\ V$ | | $V_{CNT-RL-TH} = 1.9 - 2.4\ V$ | |
| NO RELEASE/DISTURB | | NO RELEASE/DISTURB | |

NOTE: $V_{SL} = 0$

Figure 5A

RELEASE FROM "1" STATE BASED ON PARTIAL SELECTION
(Unselected Release Line RL1 at 0)

| CELL 0: SELECTED | | CELL 2: ½ SELECTED | |
|---|---|---|---|
| | (Example) | | (Example) |
| $V_{RL0} = V_{DDW}$ | (2.5 V) | $V_{RL0} = V_{DDW}$ | (2.5 V) |
| $V_{WL0} = 0$ | (0 V) | $V_{WL1} = V_{DD}$ | (1.8 V) |
| $\Delta V = V_{DDW}$ | (2.5 V) | $\Delta V = V_{DDW} - V_{DD}$ | (0.7 V) |
| $V_{CNT-RL-TH} = 1.9 - 2.4$ V | | $V_{CNT-RL-TH} = 1.9 - 2.4$ V | |
| RELEASE | | NO RELEASE/DISTURB | |

| CELL 1: ½ SELECTED | | CELL 3: NOT SELECTED | |
|---|---|---|---|
| | (Example) | | (Example) |
| $V_{RL1} = 0$ | (0 V) | $V_{RL1} = 0$ | (1.8 V) |
| $V_{WL0} = 0$ | (0 V) | $V_{WL1} = V_{DD}$ | (1.8 V) |
| $\Delta V = V_{DD}$ | (0 V) | $\Delta V = V_{DD}$ | (1.8 V) |
| $V_{CNT-RL-TH} = 1.9 - 2.4$ V | | $V_{CNT-RL-TH} = 1.9 - 2.4$ V | |
| NO RELEASE/DISTURB | | NO RELEASE/DISTURB | |

NOTE: $V_{SL} = 0$

Figure 5B

EEPROMS USING CARBON NANOTUBES FOR CELL STORAGE

CROSS-REFERENCE TO RELATED APPLICATIONS

This application is related to and claims the benefit under 35 U.S.C. §119(e) of U.S. Provisional Patent Application No. 60/543497, filed on Feb. 11, 2004, entitled "EEPROMS Using Carbon Nanotubes," which is herein incorporated by reference in its entirety.

This application is also related to and claims the benefit under 35 U.S.C. §120 to the following applications which are assigned to the assignee of this application, and are herein incorporated by reference in their entirety:

"Non-volatile Electromechanical Field Effect Transistors and Methods of Forming Same" (U.S. patent application Ser. No. 10/864,186), filed on Jun. 9, 2004; and "Nanotube-on-Gate FET Structures and Applications" (U.S. patent application Ser. No. 10/811,373), filed on Mar. 26, 2004.

BACKGROUND

1. Technical Field

The present invention relates generally to electronically erasable programmable read only memory (EEPROMS) and more specifically to bi-stable non-volatile electromechanical carbon-nanotube based EEPROMS.

2. Discussion of Related Art

Currently, most memory storage devices utilize a wide variety of energy dissipating devices which employ the confinement of electric or magnetic fields within capacitors or inductors respectively. Examples of state of the art circuitry used in memory storage include FPGA, ASIC, CMOS, ROM, PROM, EPROM, EEPROM, DRAM, MRAM and FRAM, as well as dissipationless trapped magnetic flux in a superconductor and actual mechanical switches, such as relays.

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM (Electrically-erasable programmable read-only memories) has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

EEPROMS are widely used within the computer industry to store a BIOS (basic input-output system) for a computer, sensor, or processing device, allowing it to load data and system instructions from other storage media when the unit receives first power after being in a quiescent state. The size of the BIOS is typically minimized in design because of the high cost of flash memory.

An EEPROM floating gate cell uses the presence or absence of electrons on a floating gate between the control gate and a FET channel to modulate the FET threshold voltage of a double polysilicon gate FET non-volatile storage device.

Non-volatile memory storage in products such as EEPROMs depends on significant charge transfer through the gate oxide of a storage device to and from a floating poly gate structure. Very high electric fields (>10 MV/cm for gate oxides) corresponding to high program/erase voltages in the range of 10 to 20 volts, for example, are required in the thin oxide structures of non-volatile storage devices to achieve charge transfer when cycling EEPROM storage devices between logical "1" and "0" states. By way of comparison, electric fields used in FET devices for volatile memory and logic operation are typically 5 MV/cm, corresponding to operating voltages of 5 volts or less. Trapping of electrons (and holes) in the gate oxide, sometimes referred to as the trap-up phenomenon, inhibits further tunneling injection and causes degradation in erase and program signal margins (difference between signals corresponding to "1" and "0" logic states) with cycling during memory operation, limits endurance, and slows performance [Ashok K. Sharma, "Semiconductor Memories, Technology, Testing, and Reliability", IEEE Press, 1996, pp. 275-313; pp. 116-120]. Also, the charge transfer mechanism limits programming (write) and erase times to a very slow 10 us to 1 ms range.

Endurance limits refer to the number of times bits may be cycled between "1" and "0" logic states. Assuming that oxide rupture (shorting) due to high voltage is avoided, gate oxide charge-up reduces the difference in amplitude between "1" and "0" logic states until sensing becomes unpredictable. The number of cycles is typically in the 10,000 to 100,000 range, with some products achieving up to 1 million cycles.

Data retention degradation implies a loss of stored charge on the floating gate with time due to oxide damage resulting from a combination of high voltage and charge flow through the gate dielectric. Prevention of slow leaky bits requires oxides of high integrity, and product testing after a specified number of endurance cycles prior to product shipment.

Reading the logical state of the memory requires determining the state of an EEPROM storage device, and does not require gate oxide conduction. Hence, read times may be in the range of 1 to 50 ns, for example. However, trap-up phenomena may change the threshold voltage of the FET, resulting in decreased cell current, and corresponding read time degradation (increase).

The program (write) and erase mechanisms are inherently slow, typically in the 10 us to 1 ms range. Program and erase times degrade with time because of oxide degradation due to trap-up phenomena due to multiple write-verification cycles, such trapped charge alters the electrical characteristics of the FET channel region, reducing the signal difference between "1" and "0" logic states. This degradation results in multiple write-verification cycles to store information in some bit locations and corresponding performance degradation.

EEPROM products are required to operate from a single 5 volts (or lower) power supply source. Accordingly, high voltages in the 10 to 20 volt range must be generated by on-chip voltage generators and applied to array regions. These high voltage requirements stress non-EEPROM devices as well causing a higher failure rate in the supporting CMOS circuits. In addition, such high voltage requirements make it too difficult to embed EEPROM arrays in typical CMOS logic chips.

Consequently, existing technologies are either non-volatile but are not randomly accessible and have low density, high cost, and limited ability to allow multiple writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994, 6,048,740; and 6,044,008.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and poor reliability and has not reached a state of commercialization. See U.S. Pat. Nos. 3,448,302; 4,845,533; and 4,876,667.

Wire crossbar memory (MWCM) has also been proposed. See U.S. Pat. Nos. 6,128,214; 6,159,620; and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes (CNTs), to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The use of an electromechanical bi-stable device for digital information storage has also been suggested (c.f. U.S. Pat. No. 4,979,149: Non-volatile memory device including a micro-mechanical storage element).

The creation and operation of a bi-stable nano-electromechanical switches based on carbon nanotubes (including mono-layers constructed thereof) and metal electrodes has been detailed in a previous patents and patent application of Nantero, Inc. (U.S. Pat. Nos. 6,643,165, 6,574,130, 6,784, 028, 6,706,402, and 6,835,591, and U.S. patent application Ser. Nos. 09/915,093, 10/033,323, 10/341,005, 10/341,055, 10/341,054, 10/341,130, 10/776,059, 10/776,572, and 10/967,858, the contents of which are herein incorporated by reference in their entireties).

SUMMARY

The Invention Provides EEPROMS Using Carbon Nanotubes for Cell Storage.

Under one aspect of the invention, an electrically erasable programmable read only memory (EEPROM) cell includes cell selection circuitry and a storage cell for storing the informational state of the cell. The storage cell is an electromechanical data retention cell in which the physical positional state of a storage cell element represents the informational state of the cell.

Under another aspect of the invention, the storage cell element is a carbon nanotube switching element.

Under another aspect of the invention, an electrically erasable programmable read only memory (EEPROM) cell includes cell selection circuitry and a storage cell for storing the informational state of the cell. The storage includes a nanotube switch and wherein the state of the nanotube switch represents the informational state of the cell.

Under another aspect of the invention, an electrically erasable programmable read only memory (EEPROM) cell includes cell selection circuitry and a storage cell for storing the informational state of the cell. The storage is writable with supply voltages used by said cell selection circuitry.

Under another aspect of the invention, an electrically erasable programmable read only memory (EEPROM) cell includes cell selection circuitry and a storage cell for storing the informational state of the cell. The storage is writable and readable via said selection circuitry with write times and read times being within an order of magnitude.

Under another aspect of the invention, the write times and read times are substantially the same.

Under another aspect of the invention, the storage has no charge storage or no charge trapping.

BRIEF DESCRIPTION OF THE DRAWINGS

In the drawing,

FIG. 4 illustrates waveforms applied to operation of an embodiment of the invention;

FIGS. 5-8 illustrate diagrams of electrical characteristics selected cells according to certain aspects of the invention.

DETAILED DESCRIPTION

Carbon nanotube fabric-based switches have been described in incorporated references and such description will not be repeated for the sake of brevity.

The CNT-EEPROM device of preferred embodiments uses the presence or absence of an electromechanical connection between the control gate/CNT and a polysilicon gate to modulate the FET threshold voltage of a single polysilicon gate FET non-volatile storage device. The CNT connection is used to modulate device capacitance and is not in series with the FET channel for program (write) or read operations. Thus, cell performance is relatively independent of the CNT resistance value. In each case, a select device is used in series with the EEPROM or CNT-EEPROM non-volatile storage device. The structure and operation of the CNT-EEPROM device is described below.

Also, a CNT-NVRAM cell that uses two CNT-EEPROM devices and two select devices per cell is described. Such a four device non-volatile cell can replace the more conventional flip flop with shadow EEPROM devices, typically a total of 10 to 12 devices per cell.

Figure 1:
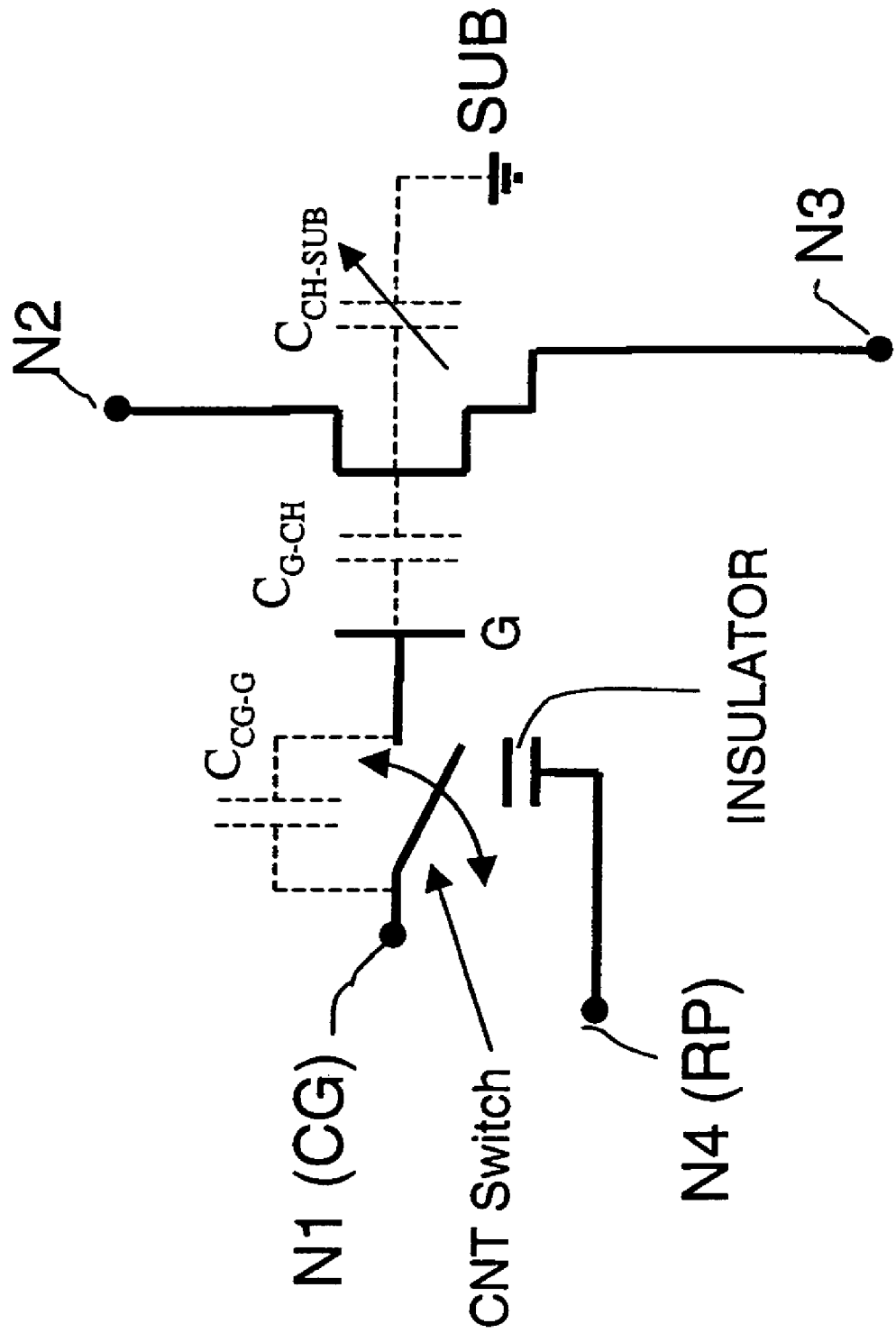
FIG. 1 illustrates a CNT-EEPROM device according to one aspect of the invention.

FIG. 1 illustrates a CNT-EEPROM device of certain embodiments. It has internal device capacitive coupling. The voltage $V_G$ of gate G is determined by modulating the internal device capacitive network such that the control gate node (node N1 (CG)) is in electrical contact with gate G via a CNT switch, or gate G is capacitively coupled to control gate CG by capacitor $C_{CG-G}$. When CNT switch is not in contact with gate G, CNT switch is in contact with the insulator of release plate N4(RP). The capacitance network is modulated (activated) by controlling the presence or absence of an FET channel using a diffusion voltage applied to diffusion N2 or N3. This modulation (activation, write) mechanism is well known and is described in the referenced applications. A sufficiently large voltage is applied to the control gate CG, node N1, such that an FET channel is formed. If the diffusion voltage on diffusion N2 or N3 is zero, the channel remains, eliminating $C_{CH-SUB}$ from the capacitance network. If the diffusion voltage on diffusion N2 or N3 is positive, 0.5 to 1.0 volts, for example, then electrons are removed from the channel region, and $C_{CH-SUB}$ capacitance is part of the device (cell) capacitance network. Capacitance values are selected by design. Typical relative capacitance values are $C_{CG-G}=0.25$, $C_{G-CH}=1$, and $C_{CH-SUB}=0.2$, for example.

Figure 2:
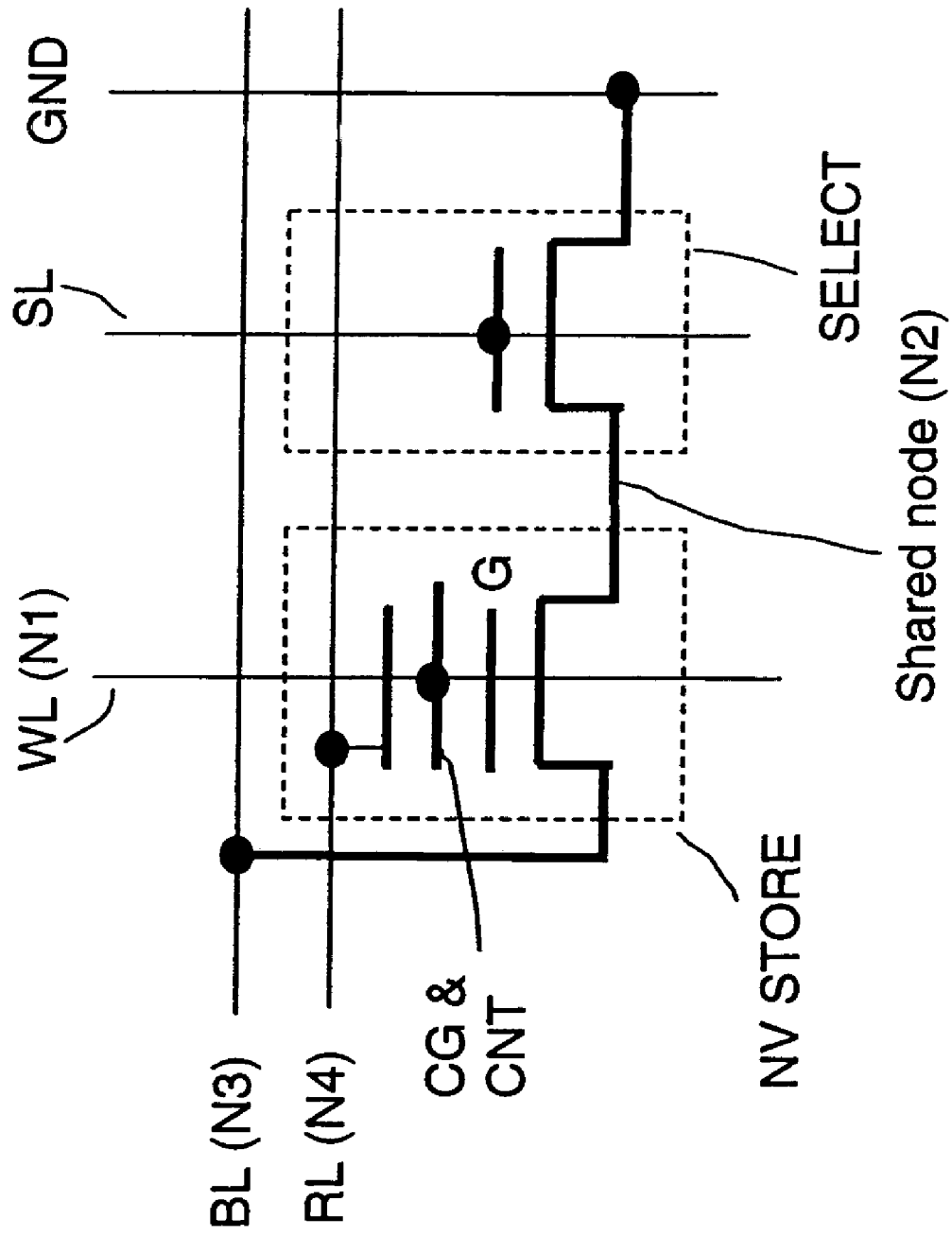
FIG. 2 illustrates the device of FIG. 1 as the NV Store device, in series with a select transistor.

FIG. 2 illustrates the device of FIG. 1 referred to as the NV Store device, in series with a select transistor. If the CNT switch is programmed (in contact with floating gate G), the cell is in the "1" state. If the CNT switch is released (not in contact with floating gate G), the cell is in the "0" state. The bit line BL is connected to the NV Store device, and is used during both read and write. During read, bit line BL is precharged, word line WL transitions to a higher voltage than the FET threshold voltage, select line SL transitions to a high voltage ($V_{SL}=V_{DD}$, for example) and turns the select transistor ON. If CG is electrically connected to G by a CNT switch, then $V_G$ exceeds the $V_{TH}$ of the FET, current flows, and BL discharges. If CG is capacitively coupled to G, then $V_G$ is less than the $V_{TH}$ of the FET, no current flows, and BL is not discharged.

By way of example, if a programmed "1" state is stored, control gate CG is electrically connected to floating gate G by a CNT switch. Assuming $V_{TH}$ of the FET is 0.8 volts and the control gate voltate is 1.5 volts, then voltage $V_G=V_{CG}=1.5$ volts, the channel regions of the NV store and select transistors are both ON, and the precharged bit line BL is discharged to ground. The bit line precharge read voltage may be 0.5 to 1 volt, for example. If a released "0" state is stored, floating gate G is not electrically connected to control gate CG but is capacitively coupled instead. For a control voltage of 1.5 volts, and a capacitance network having typical relative capacitance values of $C_{CG-G}=0.25$, $C_{G-CH}=1$, and $C_{CH-SUB}=0.2$, for example, floating gate voltage $V_G=0.6$ volts, NV store device channel region is OFF, and bit line BL is not discharged. The voltage difference between control voltage and floating gate voltage is 0.9 volts. Therefore CNT switch write (program) threshold voltage $_{CNT-WR-TH}$ must be greater than 0.9 volts.

Figure 7:
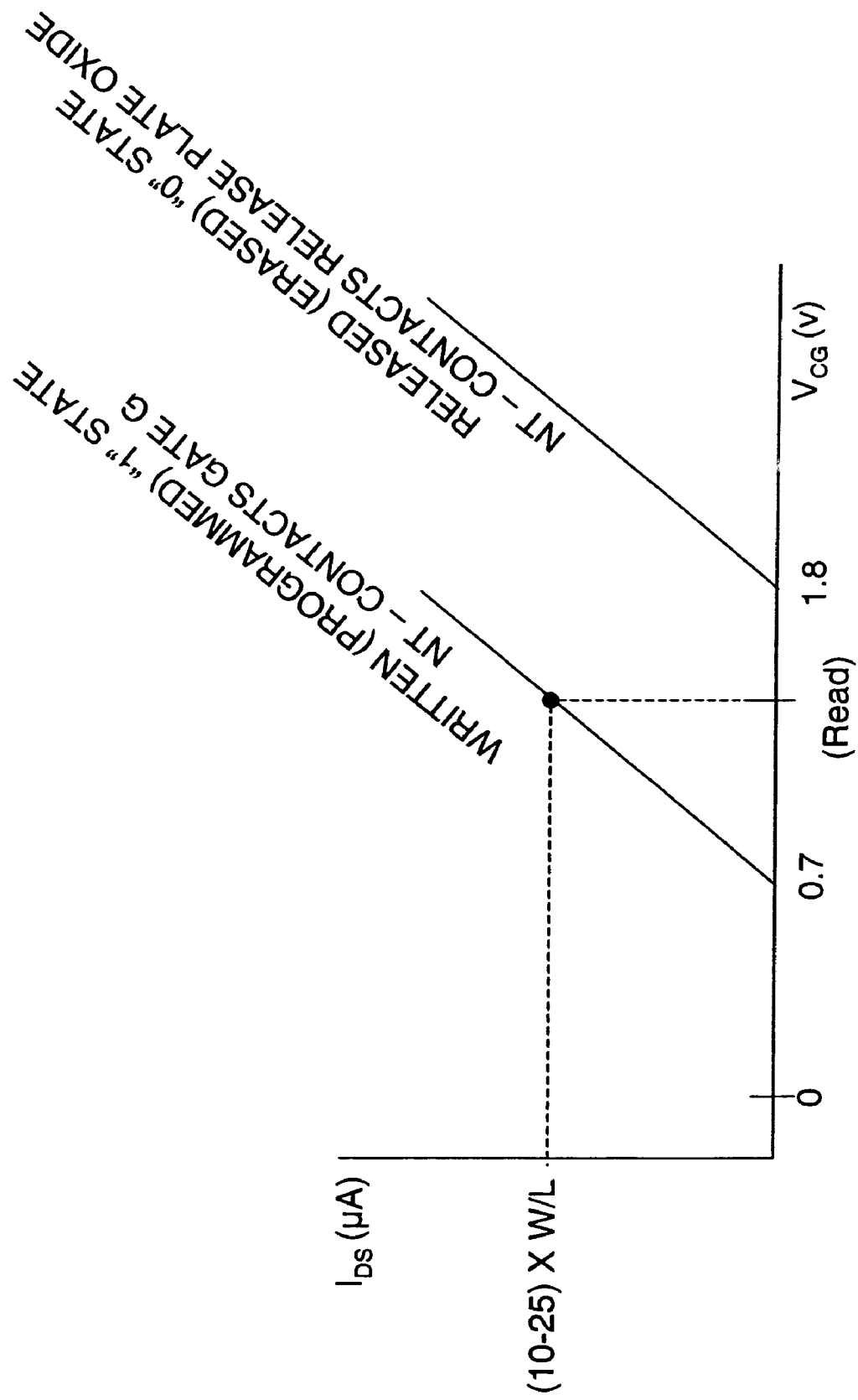

FIG. 7 further below illustrates the NV store device electrical characteristic in the write (programmed) "1" state, and the released (erased) "0" state. As illustrated in FIG. 7, if the control voltage $V_{CG}$ is greater than 0.7 of volt but less than 1.8 volts, 1.5 volts for example, bit line BL will be discharged if the NV store device is programmed to a "1" state, but will not discharge the NV store device is released to a "0" state. The read operation is further illustrated in FIG. 8.

One mode of writing (programming) the NV Storage device of FIG. 2 using bit line BL requires the device to be in a released (erased) state, with the CNT switch in contact with the insulator of the release plate N4 Therefore, one method of writing (write mode) is release-before-write. Select line (SL) voltage $V_{SL}=0$ such that shared node N2 is floating. Release is accomplished using a select scheme that releases individual array bits, or groups of bits, as described further below.

Assuming the NV Store device is in the released state, write (programming) is then accomplished by setting $V_{WL}=V_{DDW}$, the required write (programming) voltage. If $V_{BL}=0$, then a channel is present in the NV storage device, gate G is tightly capacitively coupled to the channel which is at zero volts, and the voltage between CG and G is sufficiently high that the threshold voltage of the CNT switch $V_{CNT-WR-TH}$ is exceeded. The CNT switch forms an electrical contact between CG and G, and the NV Store device is in a low FET $V_{FET-TH}$ programmed state as shown in FIG. 7. If, however, the bit line voltage is set at a small positive voltage in the range of 0.5 to 1.0 volts, for example, then there is no FET channel, capacitance $C_{CH-SUB}$ is in series with the capacitance $C_{G-CH}$, gate G is not tightly coupled to ground, $V_{CNT-WR-TH}$ is not exceeded, and the NV Store device remains in the high FET $V_{FET-TH}$ released (erased) state.

By way of example, programming the NV store device to a "1" state occurs as follows. The bit line voltage of BL(N3) shown in FIG. 2 is set to zero volts, modulating the capacitance network formed when the FET gate G of storage device CNT store is activated, such that only relative capacitance values of $C_{CG-G}=0.25$ and $C_{G-CH}=1$ are in the capacitance network. Word line WL (N1) shown is connected to control gate CG & CNT, where a CNT switch is integrated in the control gate structure CG & CNT as described in the above references. Control voltage $V_{CG}$ applied to WL(N1) transitions to 1.8 volts, for example, and the capacitance network capacitively couples floating gate voltage $V_G$ to $0.2 V_{CG}$. The voltage across the CNT switch is the difference between $V_{CG}$ applied to WL(N1) and the voltage $0.2 V_{CG}$ on floating gate G, or approximately 1.45 volts. If the CNT switch write (programming) threshold voltage $V_{CNT-WR-TH}$ is less than 1.45 volts, then the CNT will switch into contact with gate G, programming the NT store device to the "1" state. If the NV store device is to store a released (erased) "0" state, no switching is needed because of the release-before-write method.

The electrical characteristics of the NT store device illustrate both the non-volatile programmed "1" state and the non-volatile released "0" state as shown in FIG. 7. Programming and releasing the NV Store device is described further below with respect to FIGS. 4, 5, and 6. The release-before-write mode described above is one operating mode. Other write modes that do not require release-before-write are described in the references.

Figure 3:
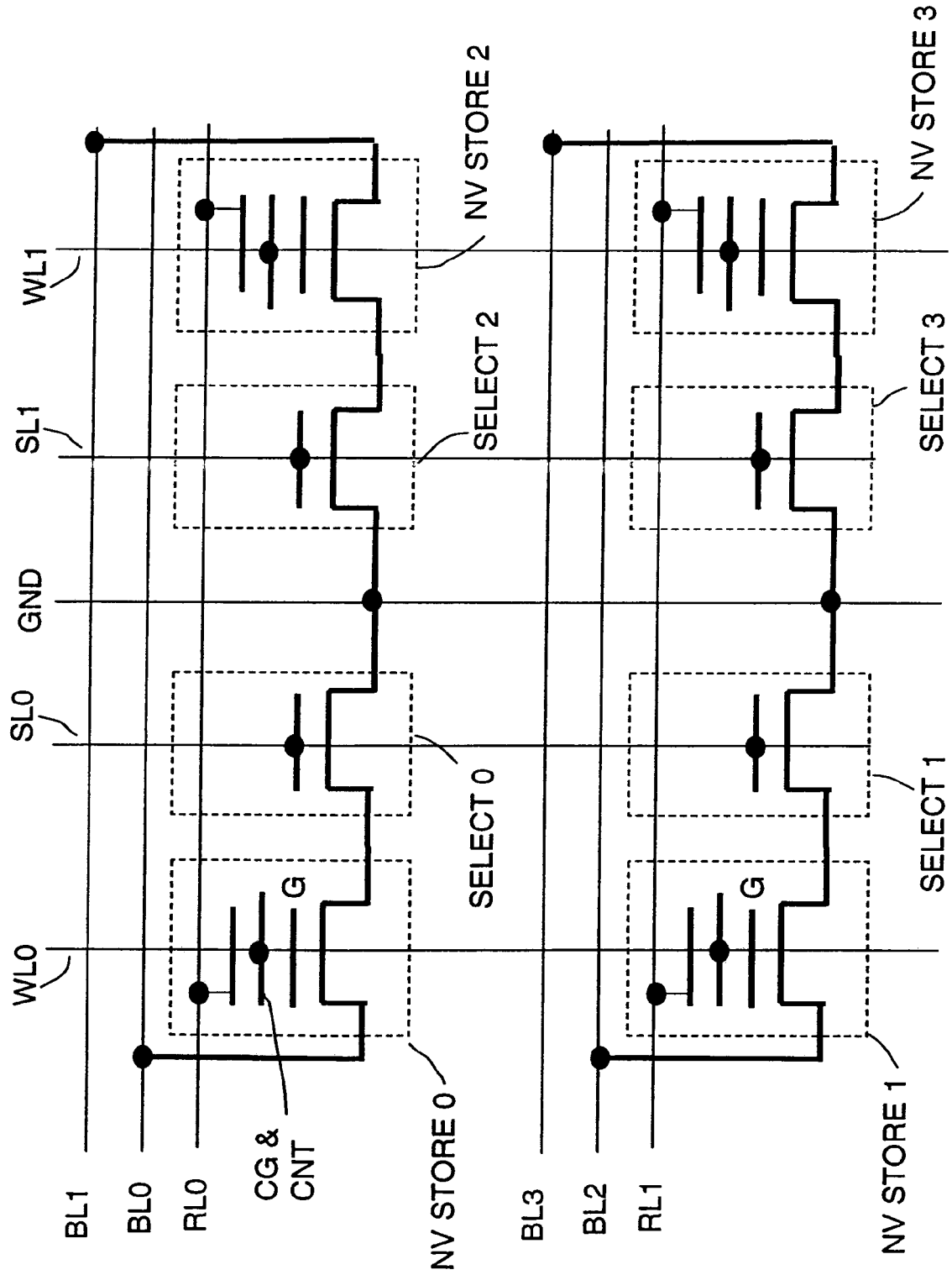
FIG. 3 illustrates a CNT-EEPROM array with four cells (Cell0-Cell3)

FIG. 3 illustrates a CNT-EEPROM array with four cells (Cell0-Cell3). The array in FIG. 3 may store a unique bit ("1" or "0") in each of the four cells connected to bit lines BL0, BL1, BL2, and BL3. Release lines RL0 and RL1 connect to corresponding release nodes, word lines WL0 and WL1 connect to control gates, and SL0 and SL1 connect to select device gates. Word lines and select lines are substantially parallel, and are substantially orthogonal to release lines and bit lines. Each cell in the CNT-EEPROM array operates as described in FIG. 2.

FIG. 4 illustrates the waveforms applied to the release lines, word lines, bit lines, and the resulting gate voltage $V_G$ of the selected cell (Cell 0 in this example) during release from a "1" and a "0" stored state. The select line voltage $V_{SL}=0$ and isolates the NT storage device from ground. The word line voltage $V_{WL}$, which corresponds to control gate voltage $V_{CG}$ associated with control gate node N1(CG) of FIG. 1, is set to zero ($V_{WL}=0$). If NT store 0 is in a programmed "1" state, the CNT switch connects the CG & CNT node and floating gate G. The release voltage $V_{RL}$ is switched to $V_{DDW}$. The voltage $V_{DDW}$ must exceed the release threshold voltage of the CNT switch $V_{CNT-RL-TH}$ in order to release (erase) the "1" state. The release threshold voltage may differ from the program (write) threshold voltage $V_{CNT-WR-TH}$. By way of example, for release voltage $V_{DDW}=2.5$ volts, the release threshold voltage $V_{CNT-RL-TH}$ maximum is less than 2.5 volts. To prevent adjacent "bit disturb," $V_{CNT-RL-TH}$ must be greater than 1.8 volts, for example, as shown further below. Once released, the floating gate voltage is not longer at ground level but assumes a voltage between 0 and $V_{DD}$. If NT store 0 is in a released "0" state, the CNT switch is not connected to $V_G$ and is therefore is already in a released (erased) state, and remains in the released state.

FIG. 5A illustrates cell voltages at selected cells, ½ selected cells, and unselected cells in the array of FIG. 3 in which cell 0 is released, and cells 1, 2, and 3 are unchanged, and where common release line RL1 is at $V_{DD}$. The NV Store device is designed such that only cells with the full select voltage difference $\Delta V=V_{DDW}$, in this example 2.5 volts, are released. Cells storing a "1" state release when the CNT connection switches from gate G to the oxide of release plate N4 Cells storing a "0" state do not have the CNT switch connected to gate G, so no CNT switching takes place, and they remain in the released state. FIG. 5B illustrates a release operation in which cell 0 is released, and cells 1, 2, 3, and 4 are unchanged, and where common release line RL1 is at zero volts. Cells storing a "0" state do not have the CNT switch connected to gate G, so no switching takes place, and they remain in the released state.

Figure 6:
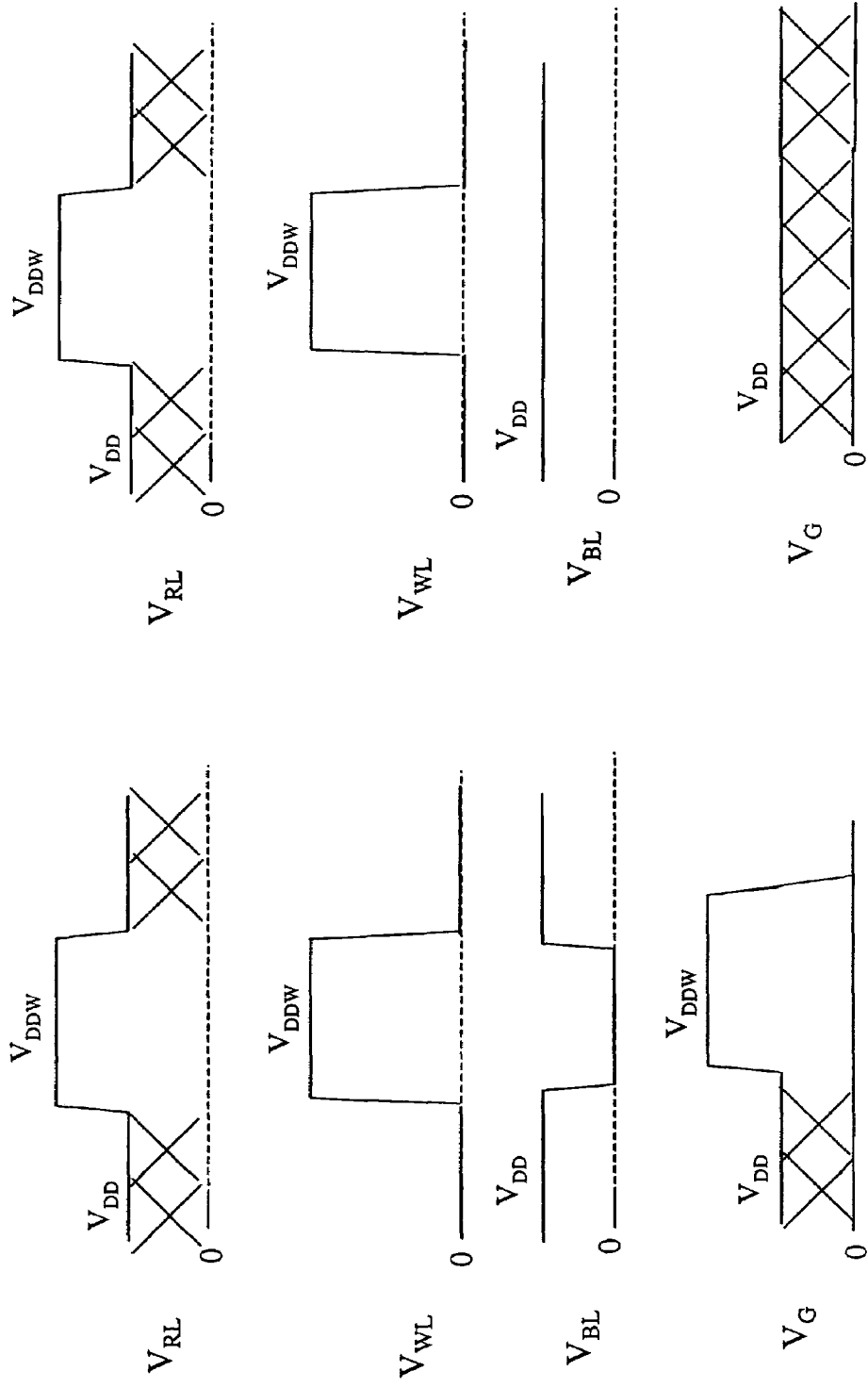

FIG. 6 illustrates writing (programming) from a released state to a "1" state, or remaining at a "0" state, controlled by bit line voltage $V_{BL}$. If $V_{BL}=0$, then a "1" state is stored in the NV Store device. By way of example, if the word line voltage transitions to $V_{DDW}=1.8$ volts, for example, then the capacitance network couples floating gate voltage $V_G$ to $0.2 \times 1.8 \approx 0.4$ volts. The write (programming) voltage across the CNT switch is therefore 1.4 volts. If $V_{CNT-WR-TH}=0.9$ to 1.2 volts, for example, then the CNT switch is programmed to the "1" state, in contact with floating gate G, with gate G voltage $V_G$ as shown in FIG. 6. If, however, the bit line voltage is positive, 0.5 to 1 volt, for example, then the capacitance network is changed because there is no FET channel in the storage device. If the word line voltage transitions to $V_{DDW}=1.8$ volts, for example, then the capacitance network couples the floating gate $V_G$ to $0.6 \times 1.8 \approx 1$ volt. The write (programming) voltage across the CNT switch is therefore 0.8 volts. If $V_{CNT-WR-TH}=0.9$ to 1.2 volts, for example, then the NV store device remains in the released state.

FIG. 7 illustrates an example of the FET I-V characteristic for a NV Store device in the written (programmed) "1" state and the released (erased) "0" state. The FET threshold voltage $V_{FET-TH}$ is approximately equal to the voltage $V_{CG}$ where the I-V characteristic intersects the horizontal axis. The read voltage applied to $V_{CG}$ is selected to be greater than the $V_{FET-TH}$ for a programmed "1" state, that is, greater than 0.7 volts, and less than the $V_{FET-TH}$ voltage for a programmed "0" state, that is, less than 1.8 volts.

Figure 8:
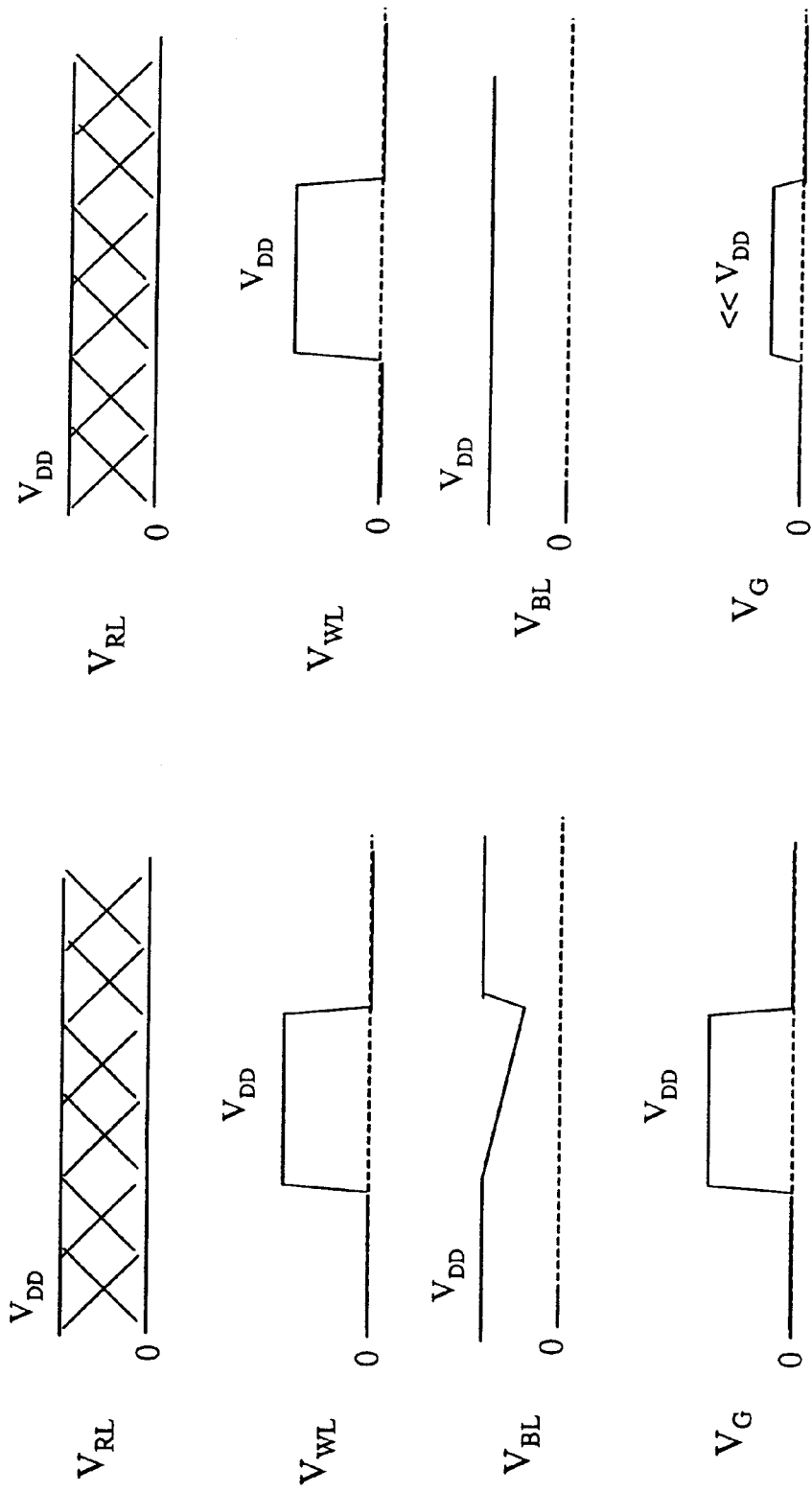

As illustrated in FIG. 8, the bit line voltage $V_{BL}$ will droop if the NV Store device is programmed to the "1" state, but will remain at $V_{DD}$ if the NV Store device is programmed to the "0" state.

Figure 9:
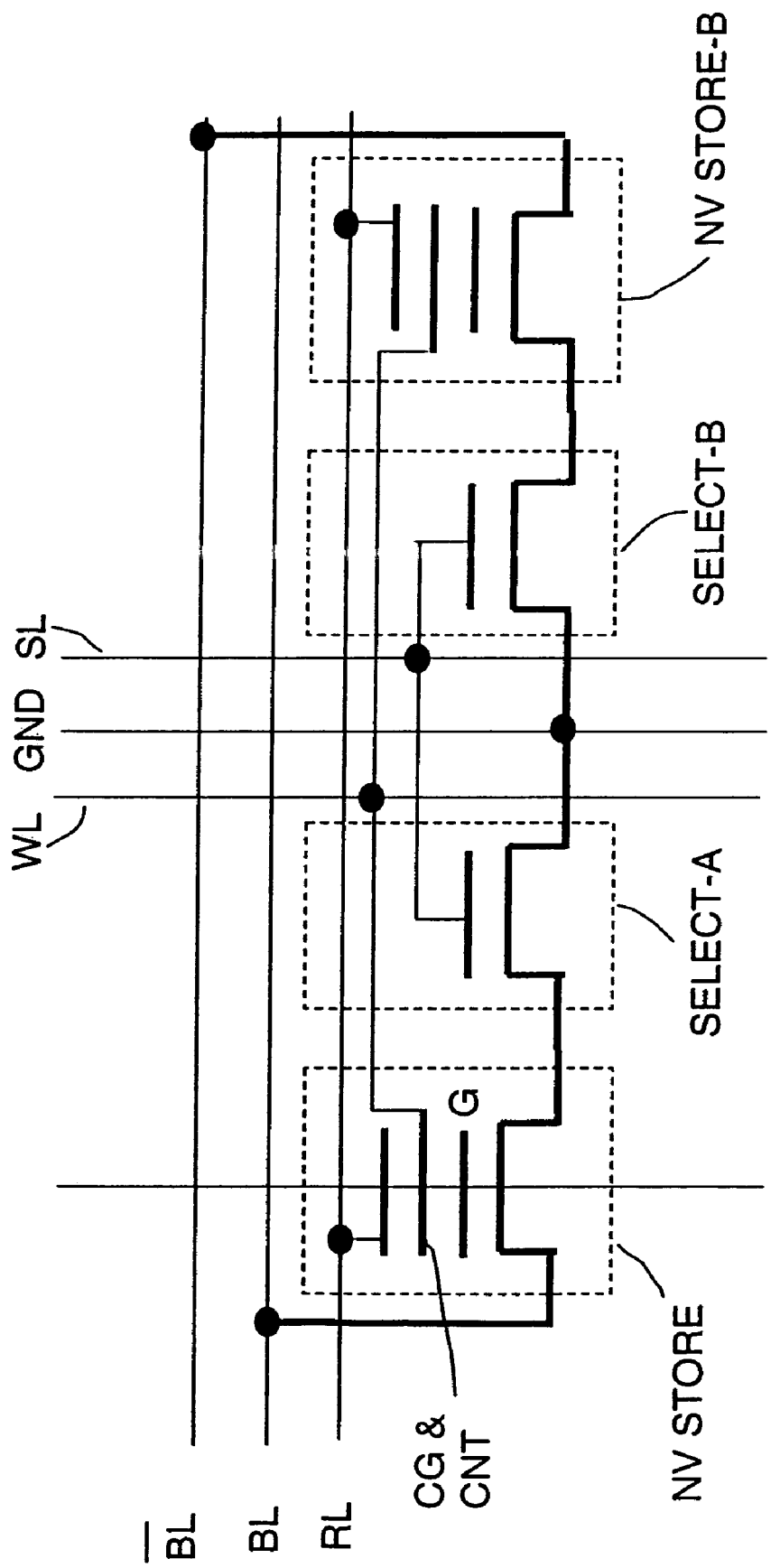
FIG. 9 illustrates a CNT-NVRAM storage cell using two CNT-EEPROM cells according to certain aspects of the invention.

FIG. 9 illustrates a CNT-NVRAM storage cell using two CNT-EEPROM cells, such that there are four transistors, two NV Store transistors and two select transistors. By comparison, a typical CNT-NVRAM using a flip flop and shadow EEPROM devices on each node has a total of 8 to 12 transistors. The CNT-NVRAM cell stores the true and complement of each data bit. The cell illustrated in FIG. 9 stores true and complement data in transistors NV Store and NV Store-b. The NV RAM of FIG. 9 uses 1 WL, 1 SL, 1 ground, 1 RL, but 2 bit lines, BL and BL-b. The operation of the CNT-NVRAM cell is similar to the CNT-EEPROM cell operation. The advantage of the CNT-NVRAM over the CNT-EEPROM cell is that one of the bit line pairs will discharge, that is BL or BL-b will discharge. This cell can therefore be sensed using sensing techniques similar to those of SRAM cells. The performance will not be gated by CNT resistance because there is no CNT resistance in series with the write or read paths (CNTs modulate the internal device capacitance). Read time is expected to be similar to the read time of an SRAM cell. Write will be longer than for an SRAM cell because of the addition of the release-before-write requirement. However, the additional delay is for the first write operation. When writing a block of data, such as in Page Mode, the release operation delay can be hidden by using an appropriate architecture. Also, write modes that not require release-before-write described in the above references eliminate the extra delay.

An aspect of the present embodiment (carbon nanotube fabric-based-CNT-EEPROMs is to solve these problems. The CNT-EEPROM uses electromechanical switching in the device to modulate an FET threshold voltage. This method of programming uses lower voltages and is faster than prior art EEPROM programming using hot electrons.

CNT-EEPROM storage device can be used to build EEPROMs and NRAMs using CNT-on-Gate. The CNT-EEPROM device is used with a select device to form the basic cell. The cell can be programmed and erased faster and at lower voltages than conventional EEPROM cells.

Preferred embodiments speed up write (program) and erase operation. They also reduce or eliminate endurance limitations, data retention degradation, read, program, and erase time degradation. They also reduce or eliminate the high program and erase voltage requirements, and enable embedded EEPROMs with CMOS logic circuits.

Preferred embodiments eliminate the charge transfer storage mechanism to and from a floating gate embedded in a gate oxide, as is done in conventional EEPROM. More specifically, to replace the charge transfer storage mechanism to and from a polysilicon non-volatile storage gate, preferred embodiments use a non-volatile nanotube storage device. Non-volatile storage using a nanotube mechanical state enables EEPROMs that can program (write) and erase (release) at voltage levels of 5 volts and below. Also, such EEPROM operate such that read, write (program) and erase times are substantially the same, 1 to 50 ns, for example. Also, supporting CMOS circuits can operate at standard CMOS voltage levels of 5 volts and below. Also, such EEPROM devices can be embedded in CMOS logic circuits.

The following patent references refer to various techniques for creating nanotube fabric articles and switches and are assigned to the assignee of this application, each of which is hereby incorporated by reference in their entirety:

U.S. patent application Ser. No. 10/341,005, filed on Jan. 13, 2003, entitled Methods of Making Carbon Nanotube Films, Layers, Fabrics, Ribbons, Elements and Articles;

U.S. patent application Ser. No. 09/915,093, filed on Jul. 25, 2001, entitled Electromechanical Memory Array Using Nanotube Ribbons and Method for Making Same;

U.S. patent application Ser. No. 10/033,032, filed on Dec. 28, 2001, now U.S. Pat. No. 6,784,028, entitled Methods of Making Electromechanical Three-Trace Junction Devices;

U.S. patent application Ser. No. 10/033,323, filed on Dec. 28, 2001, entitled Electromechanical Three-Trace Junction Devices;

U.S. patent application Ser. No. 10/128,117, filed on Apr. 23, 2002, now U.S. Pat. No. 6,835,591, entitled Methods of NT Films and Articles;

U.S. patent application Ser. No. 10/341,055, filed Jan. 13, 2003, entitled Methods of Using Thin Metal Layers to Make Carbon Nanotube Films, Layers, Fabrics, Ribbons, Elements and Articles;

U.S. patent application Ser. No. 10/341,054, filed Jan. 13, 2003, entitled Methods of Using Pre-formed Nanotubes to Make Carbon Nanotube Films, Layers, Fabrics, Ribbons, Elements and Articles;

U.S. patent application Ser. No. 10/341,130, filed Jan. 13, 2003, entitled Carbon Nanotube Films, Layers, Fabrics, Ribbons, Elements and Articles;

U.S. patent application Ser. No. 10/776,059, filed Feb. 11, 2004, entitled Devices Having Horizontally-Disposed Nanofabric Articles and Methods of Making The Same; and U.S. patent application Ser. No. 10/776,572, filed Feb. 11, 2004, entitled Devices Having Vertically-Disposed Nanofabric Articles and Methods of Making the Same.

It will be further appreciated that the scope of the present invention is not limited to the above-described embodiments but rather is defined by the appended claims, and that these claims will encompass modifications and improvements to what has been described.

What is claimed is:

1. An electrically erasable programmable read only memory (EEPROM) cell, comprising:
a cell selection transistor comprising a gate, a source, a drain, and a channel between the source and the drain; and
a storage cell for storing the informational state of the BEPROM cell, wherein the storage cell includes a gate, a source, a drain, a channel between the source and the drain, and a nanotube switch capable of at least two states,
wherein one of the source and the drain of the cell selection transistor electrically contacts one of the source and the drain of the storage cell, and
wherein the state of the nanotube switch represents the informational state of the EEPROM cell,
wherein the storage cell is writable and readable via said selection transistor with write times and read times being within an order of magnitude of each other.

2. The EEPROM cell of claim 1 wherein the storage cell is an electro-mechanical data retention cell in which the at least two states of the nanotube switch comprise at least two physical positional states.

3. The EEPROM cell of claim 2 wherein the carbon nanotube switch includes an element comprising nanotube fabric.

4. The EEPROM cell of claim 3 wherein the nanotube fabric comprises single-walled carbon nanotubes.

5. The EEPROM cell of claim 3 wherein the nanotube fabric comprises multi-walled nanotubes.

6. The EEPROM cell of claim 1 wherein the storage cell is writable with supply voltages used by said cell selection transistor.

7. The EEPROM cell of claim 1 wherein the write times and read times are substantially the same.

8. The EEPROM cell of claim 1 wherein the storage cell has no charge storage or no charge trapping.

9. The EEPROM cell of claim 1 wherein the nanotube switch comprises a nanotube element switchable into contact with the gate in response to modulation of a capacitive network.

10. The EEPROM cell of claim 1 wherein the nanotube switch is not in series with the channel of the storage cell.

11. The EEPROM cell of claim 1 wherein gate of the storage cell is a floating gate.

12. A nonvolatile random-access memory (NVRAM) cell in electrical communication with a true bit line, a complement bit line, and a select line, the NVRAM cell comprising:
first and second select transistors, each select transistor comprising a gate, a source, a drain, and a channel between the source and the drain, each select transistor selectable by activation of the select line; and
first and second storage cells, each storage cell comprising a gate, a source, a drain, a channel between the source and the drain, and a nanotube switch capable of at least two states,
wherein the first storage cell is connected to the first select transistor and is connected to the true bit line and is capable of storing a true bit state in response to activation of the first select transistor,
wherein the second storage cell is connected to the second select transistor and is connected to the complementary bit line and is capable of storing a complementary bit state in response to activation of the second select transistor;
wherein each storage cell is writable and readable via the corresponding cell selection transistor with write times and read times being within an order of magnitude of each other.

13. The NVRAM cell of claim 12 wherein the gate of each select transistor is coupled to the select line.

14. The NVRAM cell of claim 12 wherein the at least two states of the nanotube switches comprise at least two positional states.

15. The NVRAM cell of claim 14 wherein nanotube switches each include an element comprising nanotube fabric.

16. The NVRAM cell of claim 15 wherein the nanotube fabric comprises single-walled carbon nanotubes.

17. The NVRAM cell of claim 15 wherein the nanotube fabric comprises multi-walled nanotubes.

18. The NVRAM cell of claim 12 wherein each storage cell is writable with supply voltages used by said cell selection transistors.

19. The NVRAM cell of claim 12 wherein the write times and read times are substantially the same.

20. The NVRAM cell of claim 12 wherein each storage cell has no charge storage or no charge trapping.

21. The NVRAM cell of claim 12 wherein the nanotube switch comprises an element switchable into contact with the gate in response to modulation of a capacitive network.

22. The NVRAM cell of claim 12 wherein the nanotube switch is not in series with the channel of the storage cell.

23. The NVRAM cell of claim 12 wherein gate of the storage cell is a floating gate.

* * * * *